(12) United States Patent
Yatsuda et al.

(10) Patent No.: US 7,703,961 B2
(45) Date of Patent: Apr. 27, 2010

(54) LAMP, OPTICAL MODULE, VEHICLE HEADLIGHT INCLUDING THE SAME, AND METHOD FOR CONTROLLING COLOR TONE OF EMITTED LIGHT

(75) Inventors: Yasushi Yatsuda, Tokyo (JP); Shinichi Kojima, Tokyo (JP); Teruo Koike, Tokyo (JP); Yasushi Kita, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 283 days.

(21) Appl. No.: 11/424,774

(22) Filed: Jun. 16, 2006

(65) Prior Publication Data

US 2006/0285341 A1    Dec. 21, 2006

(30) Foreign Application Priority Data

Jun. 16, 2005    (JP)    ............................. 2005-176387

(51) Int. Cl.
*F21S 8/10*    (2006.01)
(52) U.S. Cl. .......................... 362/545; 362/231; 362/800
(58) Field of Classification Search ................. 362/545, 362/507, 555, 231, 800
See application file for complete search history.

(56) References Cited

U.S. PATENT DOCUMENTS

| 6,340,824 | B1 | 1/2002 | Komoto et al. ................. 257/99 |
|---|---|---|---|
| 6,520,669 | B1 * | 2/2003 | Chen et al. ................... 362/545 |
| 6,565,247 | B2 * | 5/2003 | Thominet ..................... 362/545 |
| 6,661,030 | B2 | 12/2003 | Komoto et al. ................. 257/98 |
| 6,674,097 | B2 | 1/2004 | Komoto et al. ................. 257/98 |
| 7,201,501 | B2 * | 4/2007 | Chigusa et al. ............. 362/465 |

FOREIGN PATENT DOCUMENTS

JP    11-087770 A    3/1999

* cited by examiner

*Primary Examiner*—Gunyoung T Lee
(74) *Attorney, Agent, or Firm*—Cermak Kenealy Vaidya & Nakajima LLP

(57) ABSTRACT

A lamp, an optical module, a vehicle headlight, and a method for controlling a color tone of the same can be configured to ensure visibility of the surroundings of a vehicle on a wet road in rainy weather, in dense fog, and on a snowpacked road, for example. The lamp can include a first LED chip which emits blue light, a second LED chip which emits light with a different color from blue. A wavelength conversion layer can be provided in front of light emitting areas of the first and second LED chips in an emitting direction, and can include a wavelength conversion material. A driving control unit can be configured to drive and control the first and second LED chips. The optical module can be configured to include the lamp along with optical components, such as a reflector. A vehicle headlight can include a plurality of optical modules. The control unit can be configured to control the ratio of light from the first and second LED chips, thereby obtaining light of a desired color.

24 Claims, 8 Drawing Sheets

LAMP, OPTICAL MODULE, VEHICLE HEADLIGHT INCLUDING THE SAME, AND METHOD FOR CONTROLLING COLOR TONE OF EMITTED LIGHT

This application claims the priority benefit under 35 U.S.C. §119 of Japanese Patent Application No. 2005-176387 filed on Jun. 16, 2005, which is hereby incorporated in its entirety by reference.

1. TECHNICAL FIELD

The presently disclosed subject matter relates to a lamp for a vehicular lighting device used as a headlight or an auxiliary headlight provided in a front part of a vehicle, for example, and also relates to an optical module and a vehicle headlight including the same. Also, the disclosed subject matter relates to a method for controlling color tone of emitted light from a lamp.

2. DESCRIPTION OF THE RELATED ART

A conventional LED light source for use in a vehicle lighting device has a structure shown in FIG. 1, for example.

The LED light source 1 includes: a base 2; at least one LED chip 3 (four LED chips are shown in this illustrated example) placed on the base 2; a reflector 4 provided on the base 2 to surround the LED chip 3, the reflector having a hollow portion 4a; and a fluorescent material layer 5 that fills the hollow portion 4a of the reflector 4, as shown in FIG. 1. The base 2 is formed from a material having good thermal conductivity, e.g., copper, ceramics (AlN, alumina, and the like), and silicon (Si).

Each of the illustrated LED chips 3 is mounted by die bonding or the like on a chip mounting portion formed by an electrically conductive pattern formed on the base 2. Each of the chips 3 is also electrically connected to an adjacent connecting portion formed by a similar electrically conductive pattern via a bonding wire 3a.

The hollow portion 4a vertically extends through the reflector 4 to surround all of the LED chips 3. The reflector 4 itself, or at least an inner surface thereof, has a light blocking property so as not to emit light from the LED chips 3 through the reflector 4 to the outside. Note that the inner face of the reflector 4 is preferably configured to be a reflecting surface.

The fluorescent material layer 5 is composed of a translucent material such as silicone, and a granular fluorescent material is uniformly mixed and dispersed into the translucent material. The fluorescent material is excited by light from the LED chip 3 to generate fluorescent light having a different wavelength from the excitation light.

In order to obtain white light, this conventional light source includes a combination of a blue LED chip (LED chip 3) and a fluorescent material for generating yellow light by the blue light that is used for excitation. Namely, the light source is configured to be capable of emitting pseudo-white light obtained by color mixing the blue light from the LED chip with the yellow light from the fluorescent material.

In the LED light source 1 having this configuration, the light emitted from the LED chip 3 is incident on the fluorescent material layer 5, either directly or after being reflected by the inner face of the reflector 4, and then exits upward from the fluorescent material layer 5. Then, the fluorescent material in the fluorescent material layer 5 absorbs the blue light from the LED chip 3 and generates yellow light as fluorescent light by the wavelength conversion function of the fluorescent material. The thus generated yellow light is mixed with the blue light that is directly emitted from the LED chip 3, thereby producing white light that is emitted to the outside.

As an alternative combination for obtaining white light, the conventional art described in Japanese Patent Laid-Open Publication No. Hei 11-87770 and U.S. Pat. No. 6,340,824 discloses a combination of an ultraviolet LED chip for emitting ultraviolet light and a fluorescent material for generating visible light that is approximately white, by the ultraviolet light used for excitation.

However, when the LED light source 1 having the above configuration is used as a vehicle headlight, the color tone of the white light is determined by the efficiency of wavelength conversion by the fluorescent material that is arranged around the LED chip 3 (e.g., inside the hollow portion 4a) and the amount of that fluorescent material, irrespective of an output level of the LED chip 3.

Thus, even if the output level of the LED chip 3 is changed by changing a driving current supplied to the LED chip 3, the color tone of the white light exiting from the LED light source 1 to the outside cannot be changed (or is difficult to be changed).

On the other hand, vehicles are used in various environments and therefore vehicle headlights, that are important to safety, should be matched to driving environments for each of the respective vehicles. For example, in a case where the headlight is turned on in fine weather, it is considered that the headlight should be light and ensure a high level of visibility as a so-called daytime running lamp.

When a road surface is wet in rainy weather, for example, the light emitted from a headlight is absorbed by the road surface at a nearby location and is easily reflected (total reflection) toward a farther location. Namely, when the road surface is wet, the visibility is significantly decreased. In addition, recognition of color can be difficult and therefore a whole field of vision can become dark and monochrome.

Moreover, when the headlight is turned on in dense fog, for example, white light beams (in particular, light beams having a short wavelength) emitted from a headlight can be easily scattered by fine drops of water that constitute the fog. Therefore, the light from the headlight has difficulty in traveling forward to a distant location, and the scattered light can dazzle an oncoming driver.

On a snowpacked road, the light from a headlight can also be scattered in a similar manner by snow crystals. Therefore, it is difficult for a driver to fully recognize the three dimensions of an object ahead of a vehicle.

For the above reasons, conventionally, a fog light which emits yellow light is used to respond to various environments, especially dense fog and a snowpacked road, and otherwise, as necessary. The fog light can be turned on so as to aid in the visibility of surroundings of a vehicle in fog, snow and other conditions. In this case, however, the fog light is a separate lighting device from the headlight and has to be additionally installed or originally provided in a vehicle, thus increasing a burden to a manufacturer or user of the vehicle.

One of the reasons that yellow light is used in the above cases is as follows. Light scattering by fine particles of fog or snow is caused by refraction, and its refraction angle is larger as a wavelength of light is shorter. Therefore the light having a longer wavelength is preferable for the above cases in order to minimize the refraction angle, for example. Note that red light having relatively longer wavelengths is not preferable for use in a front part of a vehicle (especially as a headlight).

SUMMARY

One aspect of the presently disclosed subject matter is to provide a technique related to a vehicle lighting device that can ensure visibility of surroundings of a vehicle on a wet road in rainy weather, in dense fog, on a snowpacked road, and in other driving conditions, for example.

According to another aspect of the disclosed subject matter, a lamp may include: a light source portion having a first light source for emitting light of a first color, a second light source for emitting light of a second color different from the first color, and a wavelength conversion layer provided in front of light emitting areas of the first and second light sources in an emitting direction, and containing a wavelength conversion material for wavelength converting the light of the first color; and a driving control unit for driving and controlling the first and second light sources.

In the lamp, the wavelength conversion material may be a fluorescent material which is excited by the light from the first light source and emits light having a different wavelength as compared to the light from the first light source.

The first light source may be an LED chip for emitting blue light, and the wavelength conversion material may be a fluorescent material which is excited by the blue light and emits yellow light.

In the lamp, the driving control unit can control and drive the first and second light sources to achieve a first state in which only the first light source is driven and a second state in which both the first and second light sources are driven. In this configuration, the first light source may be an LED chip for emitting blue light, the wavelength conversion material may be a fluorescent material which is excited by the blue light and emits yellow light, and the driving control unit can control current values for driving the first and second light sources to achieve a first state in which only the first light source is driven and a second state in which both the first and second light sources are driven.

According to still another aspect of the disclosed subject matter, an optical module may include: a light source portion having a first light source for emitting light of a first color, a second light source for emitting light of a second color different from the first color, and a wavelength conversion layer provided in front of light emitting areas of the first and second light sources in an emitting direction, and containing a wavelength conversion material for wavelength converting the light of the first color, the first light source and the second light source being independently controllable; a reflector unit for directing light emitted from the light source portion to an irradiation direction of the optical module; and a projection lens for focusing and projecting the emitted light toward the irradiation direction.

According to still another aspect of the disclosed subject matter, a vehicle headlight may include a plurality of the optical modules configured as described above, and a driving control unit for driving and controlling the first light sources and the second light sources of the optical modules.

According to still another aspect of the disclosed subject matter, a vehicle headlight may include a plurality of the optical modules configured as described above, and each of the optical modules may include a driving control unit for driving and controlling the first light source and the second light source.

In the above described vehicle headlights, the wavelength conversion material may be a fluorescent material which is excited by the light from the first light source and emits light having a different wavelength as compared to the light from the first light source.

In the vehicle headlights described above, the first light source may be an LED chip for emitting blue light, and the wavelength conversion material may be a fluorescent material which is excited by the blue light and emits yellow light.

The driving control unit can control the first and second light sources to achieve a first state in which only the first light source is driven and a second state in which both the first and second light sources are driven.

In the above configurations, the first light source can be an LED chip for emitting blue light, the wavelength conversion material can be a fluorescent material which is excited by the blue light and emits yellow light, and the driving control unit can control current values for driving the first and second light sources to achieve a first state in which only the first light source is driven and a second state in which both the first and second light sources are driven.

The plurality of optical modules may be configured to irradiate irradiation regions corresponding thereto, respectively. The plurality of optical modules may also be configured such that the respective second light sources have different colors of light from one another.

The above vehicle headlights may be provided with a vehicle environment information acquisition unit, and the driving control unit can drive and control the first and second light sources of the respective optical modules based on vehicle environment information acquired by the vehicle environment information acquisition unit.

The vehicle environment information can include at least one of the following: information on a steering angle of a vehicle; information on a steering angular speed; information on a speed of the vehicle; information on weather; information on time; and other types of information related to vehicle operation, driving conditions, etc.

In the above configurations, the vehicle environment information may be information on weather, and when the weather is rain, at least one of the plurality of optical modules may be driven and controlled by the driving control unit so as to shift a color tone of light emitted from the optical module to a shorter wavelength color tone.

In the vehicle headlights, the second light source may be an LED chip for emitting light of a shorter wavelength than the blue LED chip, such as a green or greenish blue LED chip, and the first and second light sources can be controlled by the driving control unit such that the color of the light emitted from the optical module can be modulated between white and greenish white.

In the above configurations, the vehicle environment information may be information on weather, and when the weather is a dense fog, snow, or after snowing, at least one of the plurality of optical modules may be driven and controlled by the driving control unit so as to shift a color tone of light emitted from the optical module to a longer wavelength side.

In the vehicle headlights, the second light source may be an LED chip for emitting light of a longer wavelength than a blue LED chip, such as an orange or yellowish orange LED chip, and the first and second light sources can be controlled by the driving control unit such that the color of the light emitted from the optical module can be modulated between white and orangish white.

According to another aspect of the disclosed subject matter, there is provided a method for controlling a color tone of light emitted from a lamp, where the lamp can include: a light source portion having a first light source for emitting light of a first color, a second light source for emitting light of a second color different from the first color, and a wavelength conversion layer provided in front of light emitting areas of the first and second light sources in an emitting direction, and containing a wavelength conversion material for wavelength converting the light of the first color; and a driving control unit for driving and controlling the first and second light sources. The method may include driving the driving control unit to drive and control the first and second light sources to adjust a ratio of light amounts emitted from the respective light sources, thereby making the lamp emit light of a desired color tone.

In the above exemplary controlling method, the first light source may be an LED chip for emitting blue light, the wavelength conversion material may be a fluorescent material which is excited by the blue light and emits yellow light, and the driving control unit can control current values for driving the first and second light sources to achieve a first state in which only the first light source is driven and a second state in which both the first and second light sources are driven.

BRIEF DESCRIPTION OF THE DRAWINGS

These and other characteristics, features, and advantages of the disclosed subject matter will become clear from the following description with reference to the accompanying drawings, wherein.

DETAILED DESCRIPTION OF EXEMPLARY EMBODIMENTS

Figure 1:
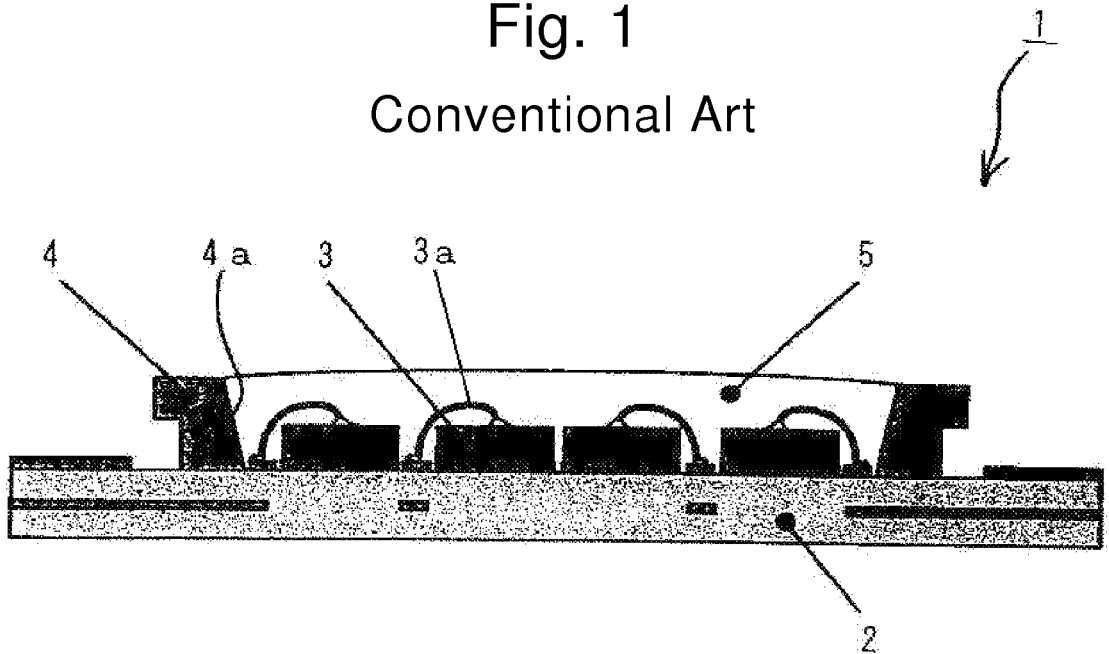
FIG. 1 is a schematic cross-sectional view showing an exemplary structure of an LED light source used in a conventional vehicle headlight.

In the configurations described above, the wavelength conversion material can perform wavelength conversion on the color of the light emitted from the first light source. Thereby, the lamp can emit both the first light of the original color and the wavelength converted light to the outside. Therefore, if the first light source is a blue LED chip for emitting blue light and the wavelength conversion material is a fluorescent material for wavelength converting light to yellow light, the yellow light is mixed with the blue light from the blue LED chip, so that white light (the resultant mixed light) is emitted to the outside.

Moreover, light from the second light source can be added to the white light (i.e., the mixed light that includes the blue light from the blue LED chip and the yellow light from the fluorescent material). Thus, the color of the light from the second light source is added to the white light.

Due to this, by changing the output of each of the light sources, a ratio of the amount of white light and amount of light of the second light source can be changed and varied. Therefore, the color tone of the light emitted to the outside can be modulated between white light and a white light that is changed to be close to the color of the light from the second light source. Note that in this exemplary embodiment the mixed light is white. However, this example is not limitative. In accordance with the principles of the disclosed subject matter, any combination of the first and second light sources and the wavelength conversion material can be used in order to obtain a desired color of light. In addition to the lamp configured above, in accordance with the principles of the disclosed subject matter, a reflector unit and a projection lens can be provided to constitute an optical module. Furthermore, a vehicle headlight in accordance with the principles of the disclosed subject matter can include a plurality of the optical modules which are controlled independently to emit light of a desired color with desired light distribution characteristics. Due to this, light distribution patterns/characteristics appropriate for various running conditions can be achieved.

In particular, when an LED chip for emitting a shorter-wavelength light, such as a green or greenish blue LED chip, is used as the second light source, the outgoing light can be modulated between white and greenish white (or bluish white) by controlling the first and second light sources by means of the driving control unit. In the case when the road surface is wet from rainy weather (which corresponds to the mixed condition case in which light is absorbed by the wet road surface and light is totally reflected by the completely-water-covered road surface) as well as in the case of extremely dark road condition due to bad weather, etc., the visibility of white objects such as a white line and the like can be improved by a vehicle headlight made in accordance with the principles of the disclosed subject matter. Moreover, the above-configured vehicle headlight can improve visibility of an object in a dark place because the object can be prevented from becoming dark and monochrome in appearance.

Furthermore, when an LED chip for emitting a longer-wavelength light such as a orange or yellowish orange LED chip is used as the second light source, the outgoing light can be modulated between white and orangish white (or reddish white) by controlling the first and second light sources by means of the driving control unit. In this case, scattering of light caused by water drops or snow crystals in fog or snowy weather can be suppressed and the visibility can be improved. Moreover, when driving in a snowpacked area, an object in the visual field does not become light or monochrome in appearance, and three-dimensional visibility can be improved. Thus, a high level of visibility that is matched to an environmental condition can be obtained by the above-described vehicle headlight.

In a vehicle headlight having a plurality of the above-referenced optical modules and a driving control unit for driving and controlling the respective optical modules, the driving control unit can drive and control the respective optical modules so as to emit light with different color tones, respectively. This vehicle headlight can emit bluish white light as a so-called diffused light distribution by the second light source that has a shorter-wavelength light directed toward various targets, such as pedestrian walkways, bicycle paths, vehicle intersections, road shoulders, or the like, for example. This can improve the visibility of a pedestrian, bicycle, other vehicle, or the like. Furthermore, the second light source can be used to emit light of a shorter wavelength and thus the vehicle headlight can emit greenish white light as a so-called converged light distribution to a farther region in a running direction. This can improve visibility in the distance. Further in this case, the second light source can be used to emit light of a longer wavelength and thus the vehicle headlight can emit orangish or yellowish white light as a so-called intermediate light distribution to a region in front of the vehicle. This can suppress scattering light in fog, snowy weather, etc., and a high level of visibility can be ensured.

As described above, with the lamp, the optical module, and the vehicle headlight in accordance with the principles of the disclosed subject matter, for example, white light can be obtained by mixing blue light from the blue LED chip serving as the first light source and yellow light from the fluorescent material serving as the wavelength conversion material. Then, the second light source is driven to emit different color light to be mixed with the white light.

In accordance with a method for controlling a color tone of emitted light, the outputs of the first and second light sources can be varied depending on the driving conditions, to change the ratio of the light amounts of the white light and light from the second light source. This can modulate light emitted to the outside between white and white that is close to the color of the light from the second light source.

In case of a conventional vehicle headlight using a white LED light source, an auxiliary headlight such as a fog light is often used when operating in fog or in snowy weather. However, in accordance with principles of the disclosed subject matter, scattering of light caused by water drops or snow crystals can be reduced by emitting white light modulated to a longer wavelength side, for example, without additionally including the above auxiliary headlight. Therefore, the headlight can provide a high level of visibility. That is, it is possible to emit white light having an appropriately modulated color tone for a diffused light distribution pattern, a converged light distribution pattern, and an intermediate light distribution pattern with regard to light distribution characteristics of the vehicle headlight. Furthermore, each optical module can be given a different light distribution region. Also, each optical module can be given a different color tone for emitted light. Therefore, a high level of visibility can be obtained by adjusting the color tone for each light distribution pattern in accordance with a driving condition of a vehicle or a change in the vehicle environment.

Hereinafter, concrete exemplary embodiments in accordance with the principles of the disclosed subject matter will be described in detail with reference to FIGS. 2 to 12

Please note that the exemplary embodiments described below include various features. However, the exemplary embodiments are not intended to limit the scope of the disclosed subject matter.

FIGS. 2 to 8 show one exemplary embodiment of a vehicle headlight to which principles of the disclosed subject matter are applied. In the description, an up-and-down direction and a back-to forth direction are defined assuming a state where a light-emitting direction of a light source is an upward direction and where an irradiation direction of a vehicle headlight is a forward direction as a reference.

Figure 2:
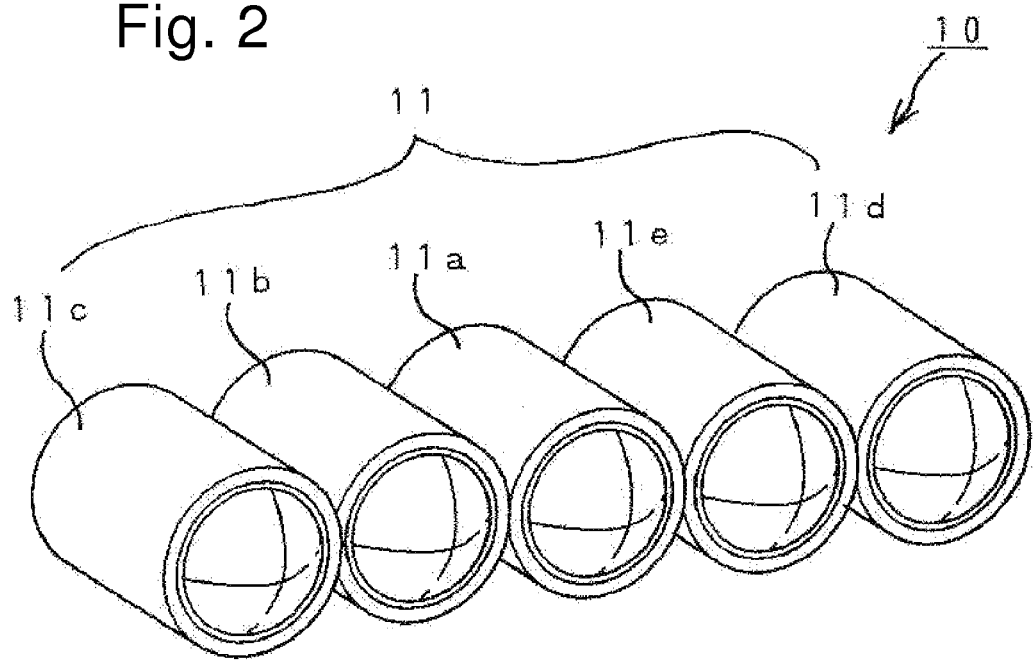
FIG. 2 is a schematic perspective view of an embodiment of a vehicle headlight made in accordance with principles of the disclosed subject matter.
Figure 3:
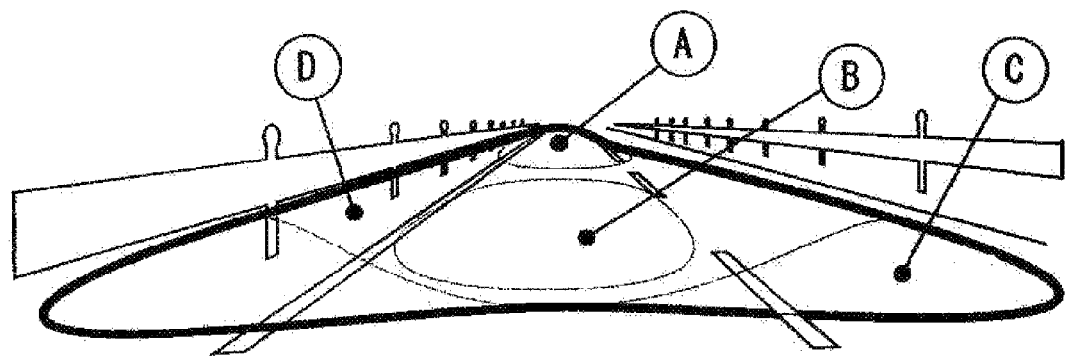
FIG. 3 is a diagram generally showing light distribution regions for respective optical modules of the vehicle headlight shown in FIG. 2.

In FIG. 2, the vehicle headlight 10 includes a plurality of optical modules 11 (five optical modules 11a to 11e are provided in this example). The optical modules 11 are arranged to illuminate different regions with light, respectively, as shown in FIG. 3.

More specifically, the optical module 11a emits light to a converged light distribution region A, the optical module 11b emits light to an intermediate light distribution region B, the optical modules 11c and 11d emit light to left and right diffused light distribution regions C, respectively, and the optical module 11e emits light to an entire light distribution region D, for example.

Figure 4:
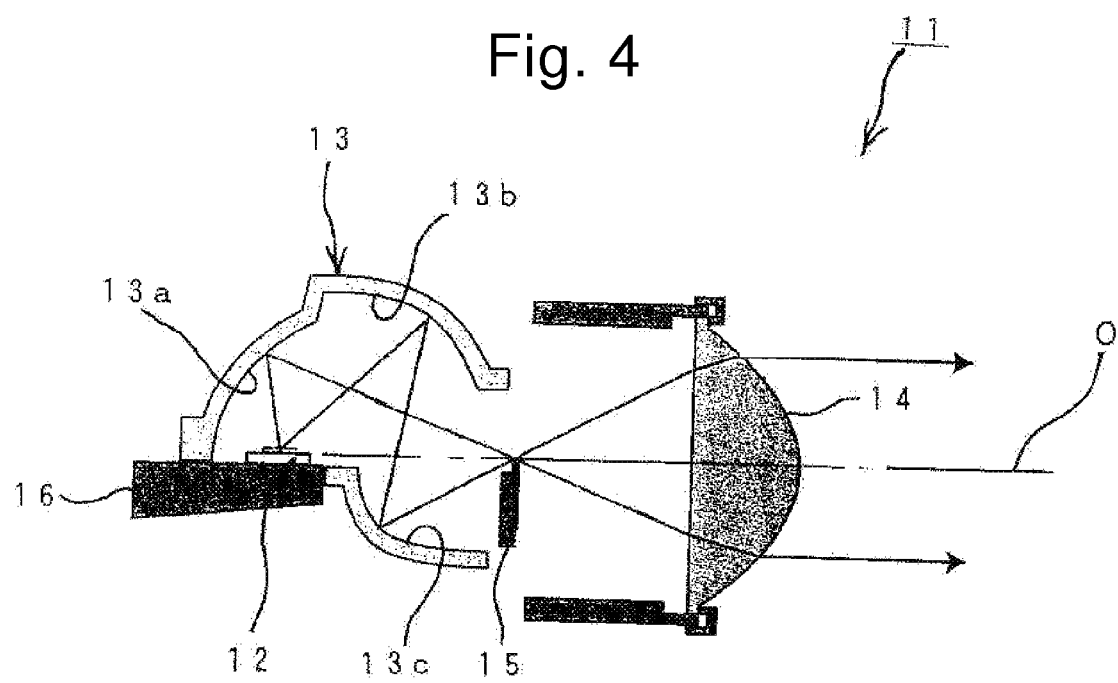
FIG. 4 is a vertical cross-sectional view showing one exemplary structure possible for each optical module of the vehicle headlight shown in FIG. 2.

Each of the optical modules 11 can be formed as shown in FIG. 4, for example.

The optical module 11 of FIG. 4 can include: a light source 12 (which may be the "light source unit" or the "lamp", and is hereinafter referred to as "an LED light source") including an LED chip; a reflector 13 for reflecting light from the LED light source 12 forward along an optical axis O of the optical module 11; a projection lens 14 arranged ahead of the reflector 13; and a shutter 15 arranged near a rear focal point of the projection lens 14.

The LED light source 12 can be formed as a light source for a vehicle headlight (or a "lamp") and is configured in such a manner that a plurality of LED chips are aligned while facing upward with respect to the horizontal optical axis O, as described in more detail later.

The LED light source 12 can be mounted on a heat sink 16 in order to dissipate generated heat, as in the shown example.

The reflector 13 can be divided into three reflecting surfaces 13a, 13b, and 13c, as in the shown example.

The first reflecting surface 13a can be arranged above the LED light source 12 with respect to the horizontal optical axis O so as to surround or substantially surround the back and sides of the LED light source 12. The first reflecting surface 13a can be formed as a spheroid, for example, and have an optical axis extending forward so that its first focal point is located near a point of light emission of the LED light source 12, and its second focal point is located near the rear focal point of the projection lens 14. Thus, light that is emitted from the LED light source 12 and that is incident on the first reflecting surface 13a is reflected by the first reflecting surface 13a and then travels toward a second focal point of the first reflecting surface 13a to be converged.

The second reflecting surface 13b can be arranged in front of the first reflecting surface 13a and above the horizontal optical axis O. The second reflecting surface 13b can also be formed as a spheroid, for example, and have an optical axis extending forward so that its first focal point is located near a point of light emission of the LED light source 12. Thus, light that is emitted from the LED light source 12 and is incident on the second reflecting surface 13b is reflected by the second reflecting surface 13b and then travels toward a second focal point thereof to be converged.

The third reflecting surface 13c can be arranged below the second reflecting surface 13b. The third reflecting surface 13c can also be formed as a spheroid, for example, and have an optical axis extending forward with its first focal point located near the second focal point of the second reflecting surface 13b, and its second focal point located near the rear focal point of the projection lens 14. Thus, light that is reflected by the second reflecting surface 13b and that is incident on the third reflecting surface 13c is reflected by the third reflecting surface 13c and then travels toward the second focal point of the third reflecting surface 13c (namely near the rear focal point of the projection lens 14) to be converged.

The projection lens 14 can be a convex lens formed of a translucent material, such as glass or plastic (such as polycarbonate). The lens 14 can be arranged in such a manner that its rear focal point is located near the second focal points of the first and third reflecting surfaces 13a and 13c. The projection lens 14 allows light directly incident thereon from the LED light source 12 or light reflected from the reflector 13 to pass therethrough and forward.

The shutter 15 can be arranged near the second focal points of the first and third reflecting surfaces 13a and 13c, i.e., near the rear focal point of the projection lens 14. An edge (upper edge) 15a thereof can be configured to block the light passing near the shutter 15 to generate a predetermined light distribution pattern.

Figure 5:
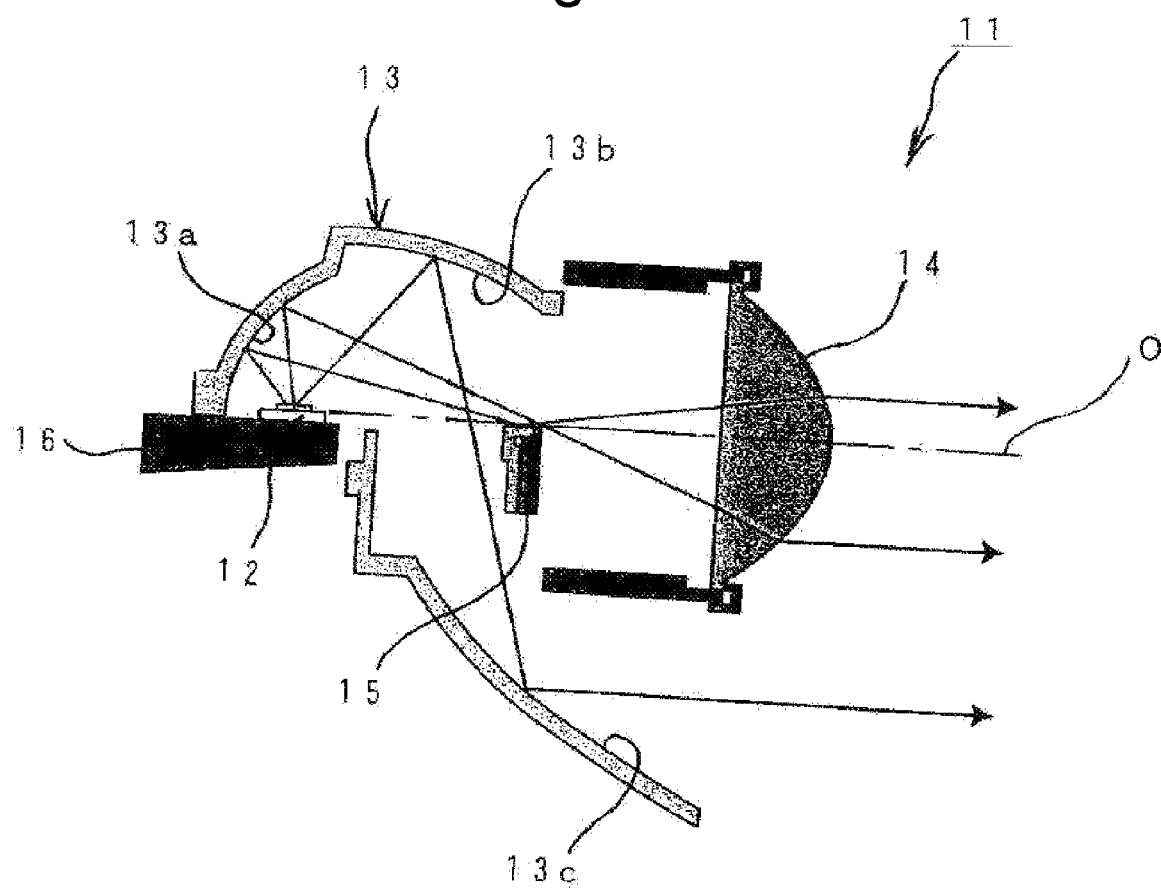
FIG. 5 is a vertical cross-sectional view showing another exemplary structure possible for each optical module of the vehicle headlight in FIG. 2.

Alternatively, the optical module 11 may be configured as shown in FIG. 5, for example.

In the optical module 11 shown in FIG. 5, the third reflecting surface 13c of the reflector 13 is formed to emit light from below the projection lens 14 forward. In this case, the third reflecting surface 13c may be formed as a revolved paraboloid, for example. Moreover, a focal point of the third reflecting surface 13c can be arranged near the second focal point of the second reflecting surface 13b, as in the optical module 11 shown in FIG. 4.

In this optical module 11 described above, light reflected by the third reflecting surface 13c is diffused. Thus, this optical module 11 is suitable for use as the aforementioned optical modules 11c to 11e.

The present embodiments are merely exemplary structures of the optical module. Alternatively, other optical modules having various optical systems can be used.

Figure 6:
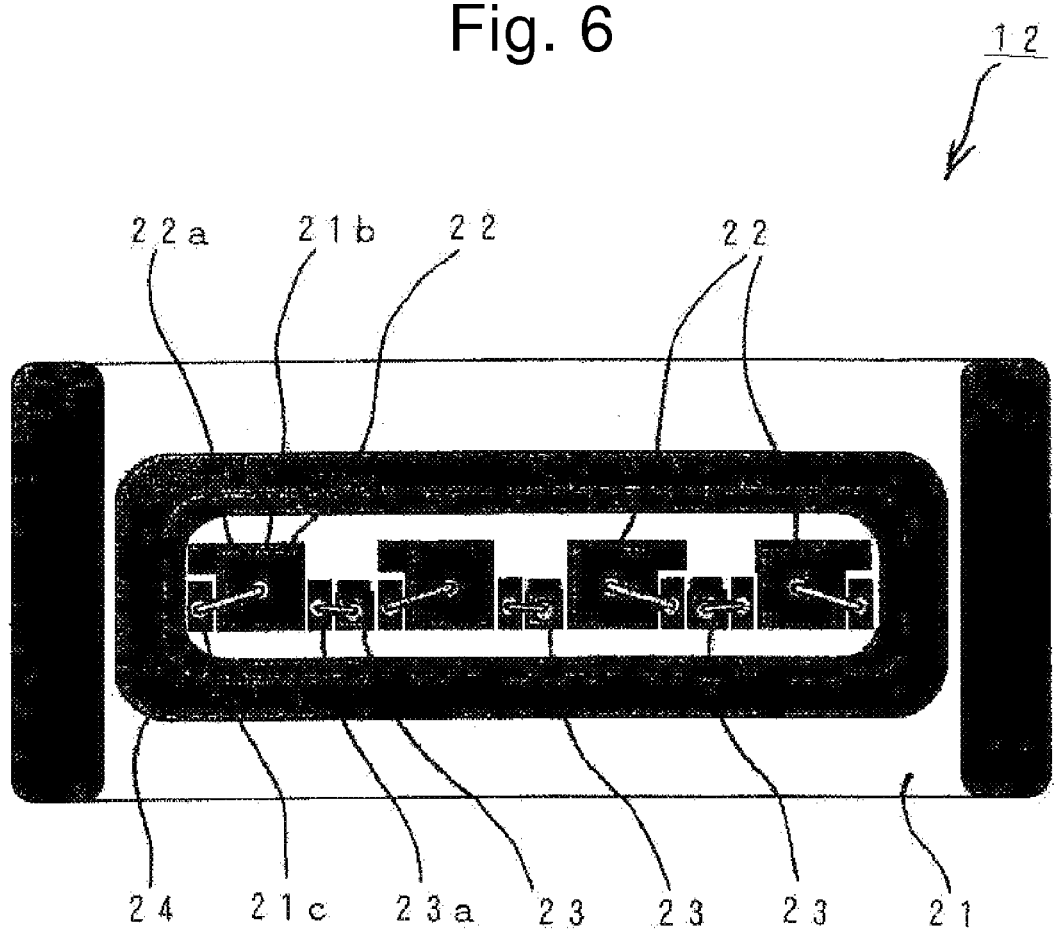
FIG. 6 is a plan view showing an exemplary structure of an LED light source made in accordance with principles of the disclosed subject matter and capable of use in the optical modules of the vehicle headlight of FIG. 2.
Figure 7:
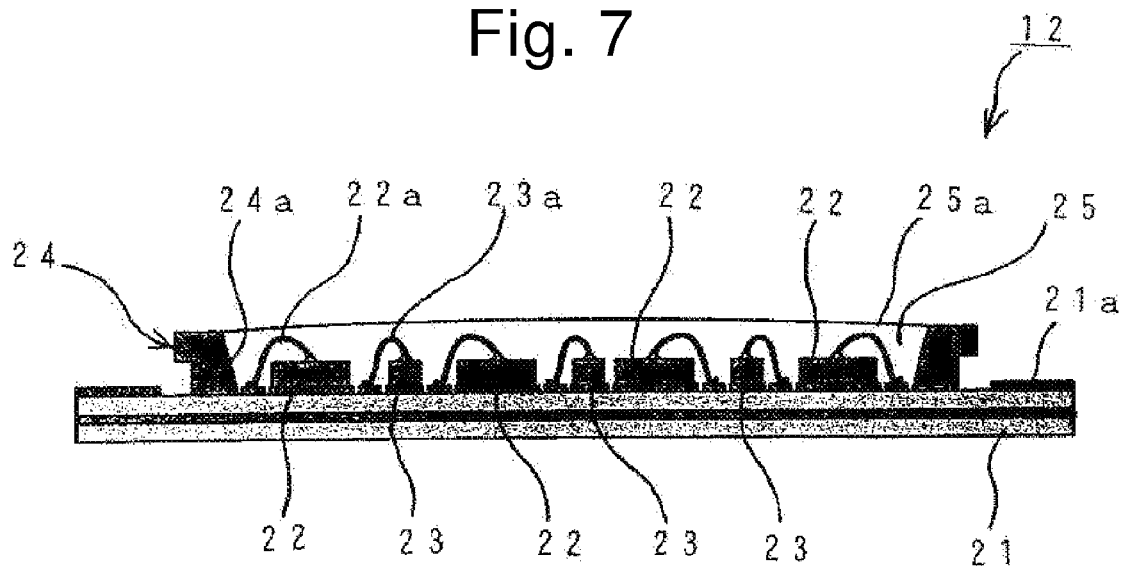
FIG. 7 is a schematic cross-sectional view of the LED light source shown in FIG. 6.

The LED light source 12 can have a structure as shown in FIGS. 6 and 7. For example, the LED light source 12 can include: at least one (four in the shown example) first LED chips 22 (to serve as the first light source) placed on a base 21; a plurality of (three in the shown example) second LED chips 23 (to serve as the second light source) placed on the base 21 between the first LED chips 22; a reflector 24 having a hollow portion 24a and provided on the base 21 to surround or substantially surround those LED chips 22 and 23; and a wavelength conversion layer 25 that can be filled in the hollow portion 24a of the reflector 24, as shown in FIGS. 6 and 7.

The base 21 can be formed from an insulating material having a high level of thermal conductance such as copper, ceramic (AlN or alumina), silicon (Si), etc. An electrically conductive pattern 21a of copper, gold, or the like can be formed on a surface of the base 21.

The base 21 may be formed as a so-called sub-mount which is formed by providing a wiring pattern made of copper, gold, etc., on a thin insulating member (made of AlN, alumina, silicon, or the like) having a high level of thermal conductance. In this case, the sub-mount is bonded to a block of copper, for example.

The respective LED chips 22 and 23 can be mounted by die bonding or other means on a chip mounting portion 21b that is formed by an electrically conductive pattern on the base 21. The chips can be electrically connected to adjacent connecting portions 21c that are formed by an electrically conductive pattern via bonding wires 22a and 23a.

In this example, the first LED chip 22 can be a blue LED chip formed of InGaN, for example.

On the other hand, the second LED chip 23 can be provided for the purpose of changing a color tone of the whole lamp. Therefore, the second LED chip 23 can be a smaller LED chip than the first LED chip 22. In addition, the second LED chip 23 may be a shorter wavelength LED chip for emitting light such as green light, greenish blue light, etc. The second LED chip 23 can alternatively be a longer wavelength LED chip for emitting longer wavelength light, such as orange light, yellow light, yellowish orange light, red light, etc. The type of chip (longer or shorter wavelength) can be determined in accordance with desired light distribution characteristics of a corresponding one of the optical modules 11a to 11e, i.e., in accordance with a corresponding one of the light distribution regions A to D. Additionally, a blue LED chip may be used as the second LED chip 23.

The reflector 24 can include a hollow portion 24a vertically extending therethrough to form a wall that surrounds (or substantially surrounds) all or a portion of the LED chips 22 and 23. The reflector 24 itself, or at least an inner surface thereof, can have a light blocking property so as not to emit light from the LED chips 22 and 23 through the reflector 24 to the outside. Note that the inner face of the reflector 24 can be configured to be a reflecting surface.

The wavelength conversion layer 25 can be formed from a translucent material such as silicone or the like, and a wavelength conversion material 25a (for example, granular fluorescent material) can be uniformly dispersed into the translucent material.

The wavelength conversion material 25a can be a fluorescent material that can be excited by blue light from the first LED chip 22 to generate fluorescent light having a different wavelength from the original light for excitation. The generated light can be a yellow fluorescent light. The fluorescent material that generates yellow light can be an yttrium aluminum garnet fluorescent material activated by Ce ($Y_3Al_5O_{12}$:Ce, $(Y,Gd)_3Al_5O_{12}$:Ce, or the like), a terbium aluminum garnet fluorescent material activated by Ce ($Tb_3Al_5O_{12}$:Ce or the like), an alkaline earth metal orthosilicate fluorescent material activated by Eu ($(Sr,Ca,Ba)SiO_4$:Eu or the like), or the like that can be practically used. These materials absorb, and are excited by, light emitted from the blue light-emitting LED chip, and generate yellowish fluorescent light.

Thus, the blue light from the first LED chip 22 and the yellow light from the wavelength conversion material 25a are mixed with each other so as to generate a pseudo-white light.

The wavelength conversion layer 25 may contain microbeads having a high refractive index in order to reduce a variation, e.g., a color variation and a brightness variation of light exiting from a surface of the wavelength conversion layer 25. In this case, light incident on the microbeads is appropriately diffused and reflected. Therefore, the variation on the surface (light-emitting surface) of the wavelength conversion layer 25 can be reduced. Instead of using the microbeads, the surface of the wavelength conversion layer 25 may be configured to have fine irregularities.

The second LED chip 23 of the light source portion (or lamp) with the above configuration can be set in the following manner depending on each of the desired functions of the optical modules 11a to 11e, for example.

In the optical module 11a that is configured for emitting light to the converged light distribution region A, an LED chip emitting light with a shorter wavelength, e.g., a green or greenish blue LED chip, for example, can be used as the second LED chip 23.

In the optical module 11b that is configured for emitting light to the intermediate light distribution region B, an LED chip emitting light with a shorter wavelength, e.g., a green or greenish blue LED chip and/or an LED chip for emitting light with a longer wavelength, e.g., an orange, yellow, or yellowish orange LED chip, can be used as the second LED chip 23.

In each of the optical modules 11c and 11d that are configured for emitting light to the diffused light distribution regions C, an LED chip emitting light with a shorter wavelength, e.g., a green or greenish blue LED chip, can be used as the second LED chip 23.

In the optical module 11e that is configured for emitting light to the entire light distribution region D, the second LED chip 23 may not be included. Alternatively, if light distribution is controlled for the entire light distribution region D, the second LED chip 23 may be included.

Figure 8:
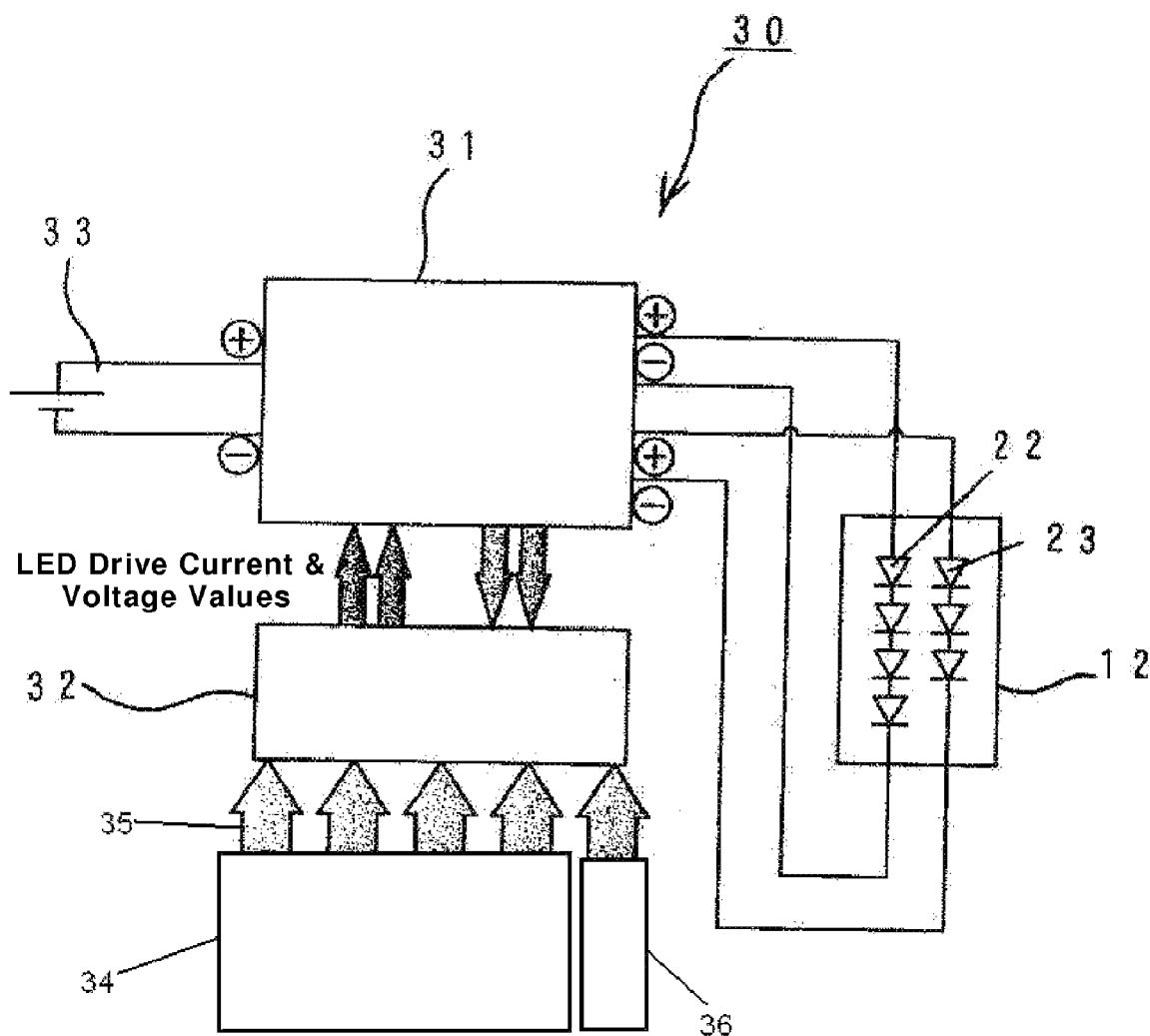
FIG. 8 is a block diagram showing an exemplary structure of a driving control unit for driving and controlling the LED light source of FIG. 6.
Figure 9:
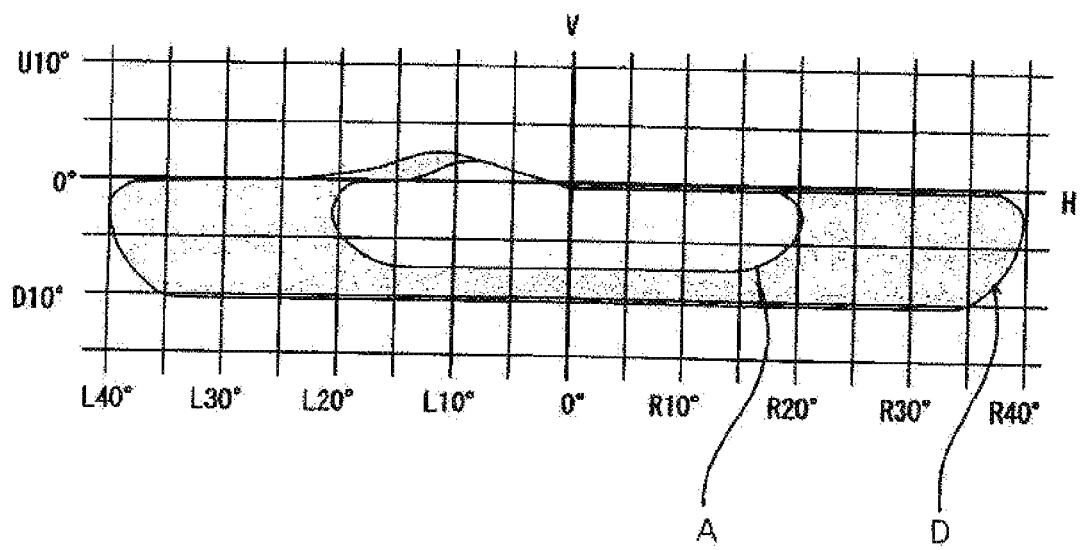
FIG. 9 is a graph showing a part of a light distribution pattern provided by the vehicle headlight of FIG. 2.
Figure 10:
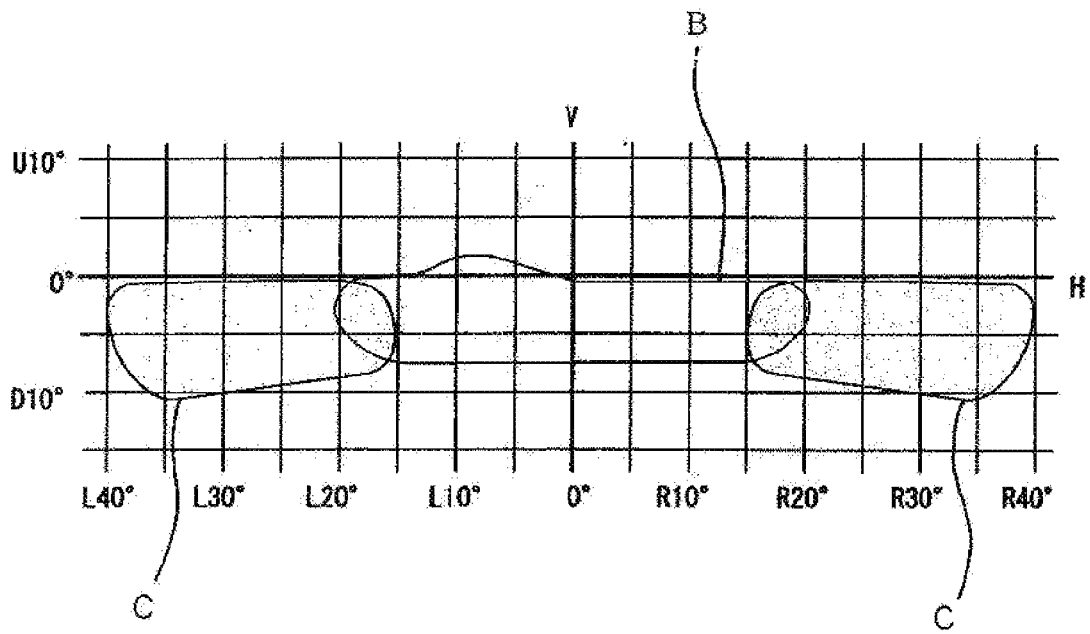
FIG. 10 is a graph showing another part of the light distribution pattern provided by the vehicle headlight of FIG. 2.

FIG. 8 shows an exemplary structure of a driving control unit for driving and controlling the respective optical modules 11.

In FIG. 8, the driving control unit 30 includes a power supply circuit 31 for supplying power to the LED light sources 12, and a control unit 32 for controlling the power supply circuit 31. Please note that the driving control unit 30 may be provided to each of the LED light sources 12 of the plurality of optical modules 11, or a single unit may be provided for controlling all of the LED light sources 12.

The power supply circuit 31 supplies a voltage from a battery 33 to the first LED chips 22 and the second LED chips 23 independently of each other.

A vehicle headlight made in accordance with the principles of the disclosed subject matter may include a vehicle environment information acquisition unit 34. The driving control unit 30 can drive and control the first and second LED chips 22 and 23 of the respective optical modules based on vehicle environment information acquired by the vehicle environment information acquisition unit 34. For example, the driving control unit 30 can be configured to allow the control unit 32 to control a driving current supplied to the first LED chips 22 and a driving current supplied to the second LED chips 23 independently of each other based on vehicle environment information 35 including a steering angle, a speed of a vehicle, weather, time, or the like acquired by the vehicle environment information acquisition unit 34 or the user operation information 36.

The vehicle headlight 10 in accordance with the principles of the disclosed subject matter can be configured such that only the first LED chips 22 in the respective optical modules 11 are normally driven by driving and controlling the respective optical modules 11 by means of the driving control unit 30.

Thus, blue light can be emitted from the first LED chip 22 and incident on the wavelength conversion material 25a in the wavelength conversion layer 25 to generate yellow fluorescent light from the wavelength conversion material 25a. The blue light from the first LED chip 22 and the yellow light from the wavelength conversion material 25a are mixed with each other to generate white light which exits from the surface of the wavelength conversion layer 25 forward (upward in FIGS. 4 and 7).

In this manner, white light is emitted from the LED light source 12 of each optical module 11 and is reflected by the reflector 13 toward the optical axis O direction. Then, the white light is converged by the projection lens 14. When passing through the light path within the module 11, the white light can be provided with light distribution characteristics that have a cut-off line extending from a center to top left by the shutter 15. Consequently, a predetermined illumination region ahead of a vehicle is irradiated with the white light (the first state).

Note that the light distribution characteristics and the illumination regions can be defined by the specifications for reflectors, shutter, and/or lens. More specifically, light emitted from the optical module 11a forms a light distribution pattern (converged light distribution region A) ahead of the optical module 11a around a center, as shown at location A in FIG. 9. Light emitted from the optical module 11e can form a light distribution pattern (entire light distribution region D) that spreads from side to side over a relatively wide angular range, as shown at location D in FIG. 9. On the other hand, light emitted from the optical module 11b can form a light distribution pattern (intermediate light distribution region B) that slightly spreads from side to side, as shown at location B in FIG. 10. Light emitted from the optical modules 11c and 11d can form light distribution patterns (diffused light distribution regions C) around left and right road shoulders, as shown at location C in FIG. 9.

In this manner, the vehicle headlight 10 forms a predetermined light distribution pattern as a whole so as to ensure a visual field ahead of a vehicle.

On the other hand, when predetermined conditions are met (for example weather condition, driving condition, or the like), the driving control unit 30 can drive and control the first and second LED chips 22 and 23 as the first and second light sources to thereby allow the lamp or the optical module to emit light of a desired color by mixing the white light with the color of the light emitted from the second LED chip 23 (the second state). In this case, the color tone can be gradually varied by adjusting the ratio of light amounts from the respective light sources. Hereinafter, the various conditions for driving and controlling will be described in detail.

Figure 11:
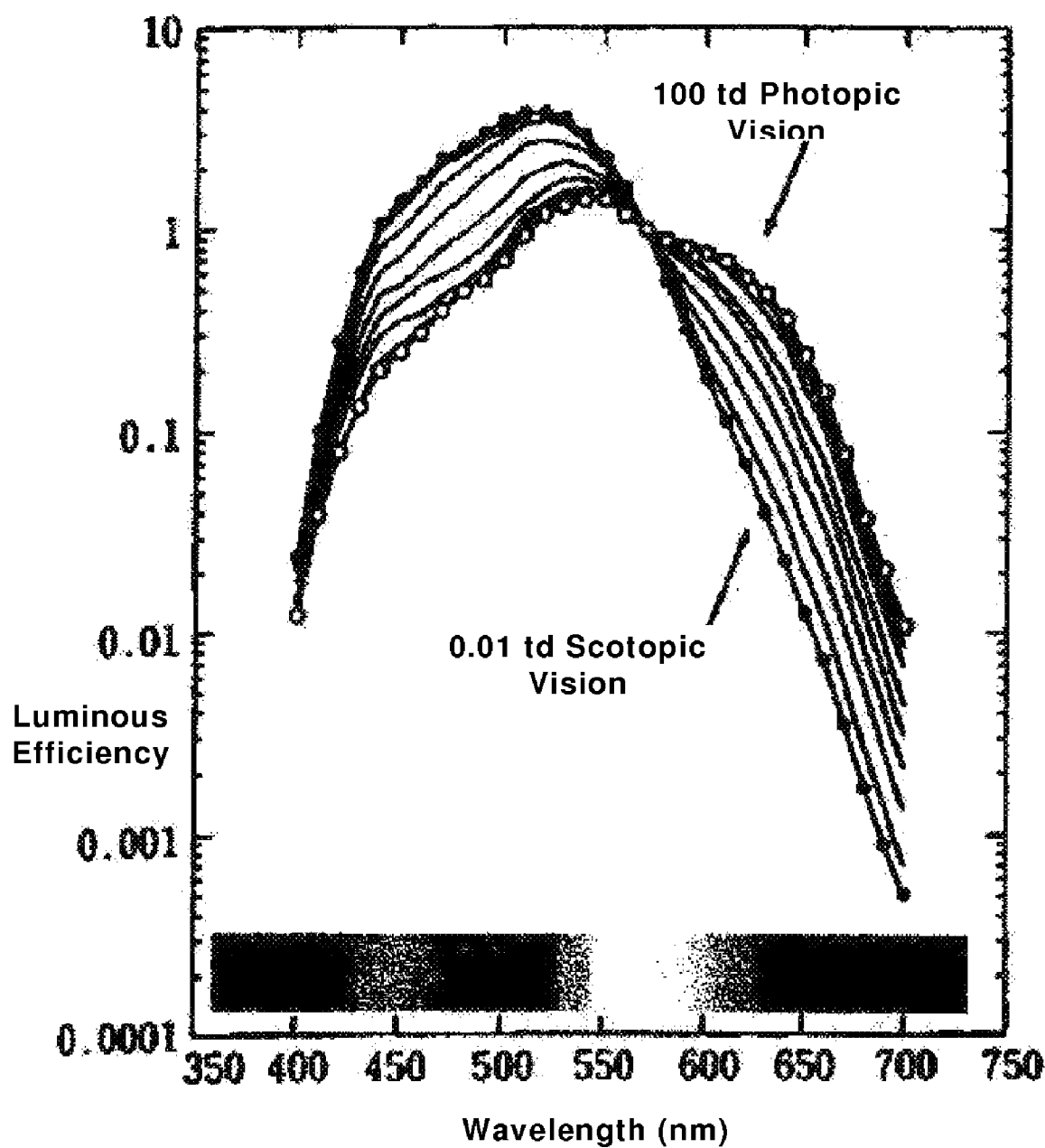
FIG. 11 is a graph showing luminous efficiency with respect to wavelengths in photopic vision and scotopic vision.

Human visual characteristics during daytime, i.e., when there is good light, are different from those at nighttime and in dark places, such as inside of a tunnel, or during storms, as shown in a graph of FIG. 11.

In a light place, i.e., in a so-called photopic vision location in which retinal illuminance is high, luminous efficiency (sensitivity) is high in a wide range of wavelengths. In a dark place, i.e., in a so-called scotopic vision location in which the retinal illuminance is low, the luminous efficiency in a short wavelength range becomes high.

Figure 12:
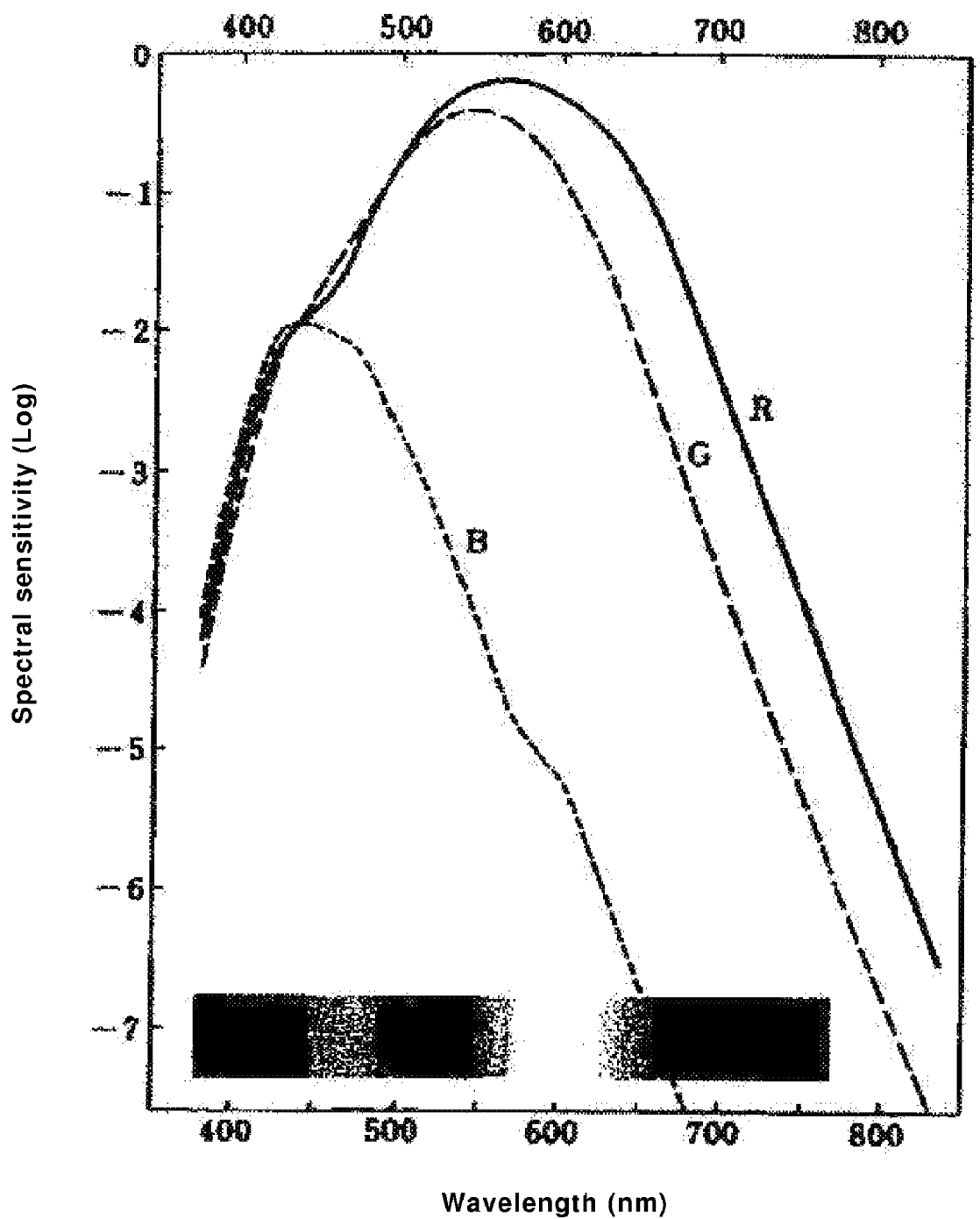
FIG. 12 is a graph showing spectral sensitivity of human eyes with respect to color.

This phenomenon is known as Purkinje phenomenon. When driving at night, spectral sensitivity for green (G) around a wavelength of 530 nm becomes high, as shown in FIG. 12.

Thus, during high-speed driving at night (for example, in the case where a vehicle speed indicated by speed information taken from a speed sensor which is a part of the vehicle environment information acquisition unit 34 is 60 km/h or more), the control unit 32 can be configured to reduce the driving current to the first LED chip 22 in the optical module 11a to reduce an amount of the white light generated by the first LED chip 22 and the wavelength conversion material 25a. At the same time, the control unit 32 supplies a driving current to the second LED chips 23 to allow the second LED chips 23 to emit green or greenish blue light, for example, that is shorter in wavelength than that of the first LED chip 22 to the converged light distribution region A. In this manner, light having spectral distribution in which green wavelengths (for which visual sensitivity of human eyes is the highest) are emphasized is emitted to the converged light distribution region A, so that visibility during high-speed driving at night can be improved.

When it rains, the control unit 32 can be configured to detect the weather by means of a rain sensor for controlling a windshield wiper (which can be a part of the vehicle environment information acquisition unit 34), and then reduce the driving current to the first LED chips 22 in the optical modules 11a and 11b to reduce the amount of the white light by the first LED chip 22 and the wavelength conversion material 25a. At the same time, the control unit 32 supplies the driving current to the second LED chips 23 in the optical modules 11a and 11b to allow the second LED chips 23 to emit green or greenish blue light, for example, that is shorter in wavelength than that of the first LED chip 22 to the converged light distribution region A and the intermediate light distribution region B.

In this manner, greenish or bluish light that is modulated to a shorter wavelength side is emitted in accordance with the visual sensitivity of human eyes that is shifted toward a shorter wavelength side in a dark place, as well as in case of mixed conditions of light absorbed by a wet road surface and light totally reflected by a completely-water-covered road surface. Thereby, the human eyes can more clearly recognize a white line and the like.

In fog or snowy weather, the control unit 32 can be configured to reduce the driving current to the first LED chip 22 in the optical module 11b to reduce the amount of the white light generated by the first LED chip 22 and the wavelength conversion material 25a, upon detection of a weather condition by the vehicle environment information acquisition unit 34 or in accordance with a user operation. At the same time, the control unit 32 can also supply a driving current to the second LED chips 23 in the optical module 11b so as to allow the second LED chips 23 to emit orange or yellowish orange light, for example, that is longer in wavelength than that of the first LED 22, to the intermediate light distribution region B.

In this manner, yellowish light that is modulated to a longer wavelength side for suppression of scattering by fine water drops or snow crystals is emitted, thereby ensuring a clear visual field in which scattering hardly occurs.

Moreover, upon a user operation, for example, the control unit 32 reduces the driving current to the first LED chips 22 in the optical modules 11c and 11d to reduce the amount of the white light generated by the first LED chips 22 and the wavelength conversion material 25a. At the same time, the control unit 32 supplies a driving current to the second LED chips 23 to allow the second LED chips 23 to emit green or greenish blue light (that is shorter in wavelength than that of the first LED chips 22) to the diffused light distribution regions C.

In this manner, bluish light that is modulated to a shorter wavelength side can be emitted towards a pedestrian or a bicycle at an intersection, a road shoulder, curb, or the like, so that the visibility of the pedestrian, bicycle, road shoulder, etc., can be improved.

As described above, the vehicle headlight 10 in accordance with the principles of the disclosed subject matter can include a plurality of optical modules each using the LED light source 12, and light exiting from each optical module 11 can be modulated from white light to a shorter or longer wavelength by selectively driving the second LED chip 23 so that a desired color tone can be obtained for each illumination region. Thus, it is possible to produce a visual field with a high level of visibility that is matched to a driving environment of a vehicle without using an auxiliary headlight such as an additional fog light.

Since light emitted from each LED light source 12 is basically pseudo-white light that is obtained by color mixture of blue light from the first LED chip 22 and yellow light from the wavelength conversion material 25a, it does not affect color discrimination in a traffic signal or a traffic sign formed with red, blue, green, or yellow colors. Even if the color tone of the light from each LED light source 12 is changed by the light from the second LED chip 23 in the above-described manner, color discrimination is not significantly affected. Therefore, the change in the color tone described above does not cause any traffic safety disadvantage.

In the aforementioned exemplary embodiments, a green LED chip, a greenish blue LED chip, an orange LED chip, and a yellowish orange LED chip are used as the second LED chip 23. However, the invention is not limited thereto. An LED chip emitting light of another color, e.g., a red LED chip or a blue LED chip can be used. In such a case, the color tone of the pseudo-white light generated by the first LED chip 22 and the wavelength conversion material 25a should be able to be modulated to a shorter or longer wavelength side of the red or blue LED chip.

However, when using a red LED chip as the second LED chip 23, it should be noted that the use of a visibly red light in a headlight that is provided in a front part of a vehicle is banned in many countries. Thus, the control unit 32 should drive and control the second LED chip 23 to achieve a color tone that cannot be recognized as red by color mixture of the pseudo-white light generated by the first LED chip 22 and the wavelength conversion material 25a and light from the second LED chip 23.

As described above, in accordance with the principles of the disclosed subject matter, an excellent lamp, optical module, vehicle headlight and its color tone control method can be provided, which can ensure visibility of surroundings of a vehicle on a wet road in rainy weather, in dense fog, and on a snowpacked road, for example, without additionally including a fog light or the like as is often done in conventional lamps.

Moreover, the vehicle headlight described above may have the following features. The vehicle headlight can be configured to include an ultraviolet LED that emits ultraviolet light, and a white LED light source using R, G, and B fluorescent materials above the ultraviolet LED. The white LED light source can have different chromaticity by changing the wavelength conversion material. A plurality of white LED light sources that are different in chromaticity can be provided in the vehicle headlight and arranged to irradiate different regions with light, respectively, thereby improving the visibility.

When using this structure, it is not necessary to perform current control for an individual light source in the vehicle headlight. Instead, by irradiating the different regions with light from the light sources of different colors, respectively, the visibility can be improved. For example, white light sources that are different in chromaticity are used for a distance, a center, and a road shoulder, respectively, so that the visibility is improved.

In addition, while the above embodiments are directed primarily at vehicle headlight systems, the principles of the disclosed subject matter can also be used in many other various types of lamps. For example, spot lights, rear lights, boat lights, traffic lights, illumination devices, and other types of lamps are contemplated for use.

While there has been described what are at present considered to be exemplary embodiments of the invention, it will be understood that various modifications may be made thereto, and it is intended that the appended claims cover such modifications as fall within the true spirit and scope of the invention. All conventional art references described above are herein incorporated in their entirety by reference.

What is claimed is

1. A lamp for use as a light source of a vehicle light comprising:
   a light source portion having a first light source including a light emitting diode configured to emit light of a first color, a second light source including a light emitting diode configured to emit light of a second color different from the first color, and a single continuous wavelength conversion layer provided in an emitting direction and in front of a light emitting area of the first light source and the second light source, the wavelength conversion layer including a wavelength conversion material configured to wavelength convert at least one of the light of the first color and the light of the second color, the light emitting diode of the second light source being smaller than the light emitting diode of the first light source;

a housing having a base and a reflector, wherein the first light source and the second light source are in the reflector, and the wavelength conversion layer is located within the reflector, and over the first light source and the second light source; and a driving control unit configured to drive and control at least one of the first light source and the second light source such that color of light emitted from the lamp is changed due to drive and control of the driving control unit.

2. A lamp for use as a light source of a vehicle light comprising:

a light source portion having a first light source configured to emit light of a first color, a second light source configured to emit light of a second color different from the first color, and a single continuous wavelength conversion layer provided in an emitting direction and in front of a light emitting area of the first light source and the second light source, the wavelength conversion layer including a wavelength conversion material configured to wavelength convert at least one of the light of the first color and the light of the second color;

a housing having a base and a reflector, wherein the first light source and the second light source are in the reflector, and the wavelength conversion layer is located within and in contact with the reflector, the first light source and the second light source; and a driving control unit configured to drive and control at least one of the first light source and the second light source such that color of light emitted from the lamp is changed due to drive and control of the driving control unit, wherein the first light source and second light source each include a light emitting diode chip and the light emitting diode chip of the second light source is smaller than the light emitting diode chip of the first light source.

3. The lamp according to claim 2, wherein the wavelength conversion material is a fluorescent material which is configured to be excited by the light from one of the first light source and the second light source such that the fluorescent material emits light having a different wavelength from the light from the one of the first light source and the second light source.

4. The lamp according to claim 2, wherein the first light source includes an LED chip configured to emit blue light, and the wavelength conversion material is a fluorescent material which is configured to emit yellow light when excited by the blue light.

5. The lamp according to claim 2, wherein the driving control unit is configured to control and drive the first and second light sources to achieve a first state in which only the first light source is driven and a second state in which both the first and second light sources are driven.

6. The lamp according to claim 2, wherein the first light source includes an LED chip configured to emit blue light, the wavelength conversion material is a fluorescent material which is configured to emit yellow light when excited by the blue light, and the driving control unit is configured to control current values for driving the first and second light sources to achieve a first state in which only the first light source is driven and a second state in which both the first and second light sources are driven.

7. The lamp according to claim 2, wherein the single continuous wavelength conversion material is configured to wavelength convert light of the first color emitted from the first light source a first predetermined amount and light of the second color emitted from the second light source a second predetermined amount, wherein the first predetermined amount is greater than the second predetermined amount.

8. An optical module for a vehicle light comprising:

a lamp including;

a light source portion having a first light source configured to emit light of a first color, a second light source configured to emit light of a second color different from the first color, a single continuous wavelength conversion layer provided in an emitting direction and in front of a light emitting area of the first light source and the second light source, the wavelength conversion layer including a wavelength conversion material configured to wavelength convert light, the first light source and the second light source being independently controllable such that color of light emitted from the optical module is changed when the first light source and the second light source are independently controlled, a light emitting diode chip of the second light source being smaller than a light emitting diode chip of the first light source; and a housing having a base and are reflector, wherein the first light source and the second light source are in the reflector, and the wavelength conversion layer is located within and in contact with the reflector, the first light source and the second light source a reflector unit configured to direct light emitted from the light source portion to an irradiation direction of the optical module; and a projection lens configured to focus and project light emitted from the light source portion toward the irradiation direction.

9. The optical module according to claim 8, wherein the optical module is configured as a vehicle headlight, comprising:

a plurality of the optical modules; and a driving control unit configured to drive and control the first light sources and the second light sources of the optical modules.

10. The optical module according to claim 8, wherein the optical module is configured as a vehicle headlight comprising a plurality of the optical modules, each of the optical modules including a driving control unit configured to drive and control the first light source and the second light source.

11. The optical module according to claim 9, wherein the wavelength conversion material is a fluorescent material which is configured to emit light having a different wavelength from the light from the first light source when excited by the light from the first light source.

12. The optical module according to claim 9, wherein the first light source includes an LED chip configured to emit blue light, and the wavelength conversion material is a fluorescent material which is configured to emit yellow light when excited by the blue light.

13. The optical module according to claim 9, wherein the driving control unit is configured to control the first and second light sources to achieve a first state in which only the first light source is driven and a second state in which both the first and second light sources are driven.

14. The optical module according to claim 9, wherein the first light source includes an LED chip configured to emit blue light, the wavelength conversion material is a fluorescent material which is configured to emit yellow light when excited by the blue light, and the driving control unit is configured to control current values for driving the first and second light sources to achieve a first state in which only the first light source is driven and a second state in which both the first and second light sources are driven.

15. The optical module according to claim 13, wherein the plurality of optical modules are configured to irradiate irradiation regions corresponding thereto, respectively, and a first optical module of said plurality of optical modules irradiates a first irradiation region and a second optical module of said plurality of optical modules irradiates a second irradiation region that is different from said first irradiation region.

16. The optical module according to claim 13, wherein the plurality of optical modules are configured such that respective second light sources have a different color of light with respect to each other.

17. The optical module according to claim 13, further comprising
 a vehicle environment information acquisition unit, wherein the driving control unit is configured to drive and control the first and second light sources of respective optical modules based on vehicle environment information acquired by the vehicle environment information acquisition unit.

18. The optical module according to claim 17, wherein the vehicle environment information includes at least one of, information regarding a steering angle of a vehicle, information regarding a steering angular speed, information regarding a speed of the vehicle, information regarding weather, and information regarding time.

19. The optical module according to claim 17, wherein the vehicle environment information is information regarding weather, and when the weather is determined to be rain, at least one of the plurality of optical modules is driven and controlled by the driving control unit so as to shift a color tone of light emitted from the at least one of the optical modules to a shorter wavelength.

20. The optical module according to claim 17, wherein the vehicle environment information is information regarding weather, and when the weather is determined to be one of a dense fog, snow, and recent snow, at least one of the plurality of optical modules is driven and controlled by the driving control unit so as to shift a color tone of light emitted from the at least one of the optical modules to a longer wavelength.

21. The optical module according to claim 19, wherein the second light source includes an LED chip configured to emit light of a shorter wavelength than light emitted from a blue LED chip, and the first light source and the second light source are configured to be controlled by the driving control unit such that the color of light emitted from the optical module can be modulated between white and greenish white.

22. The optical module according to claim 20, wherein the second light source includes an LED chip configured to emit light of a longer wavelength than light emitted from a blue LED chip, and the first light source and the second light source are configured to be controlled by the driving control unit such that the color of light emitted from the optical module can be modulated between white and orangish white.

23. A method for controlling a color tone of light emitted from a lamp, the lamp configured for use as a light source of a vehicle light, comprising
 providing a light source portion having a first light source configured to emit light of a first color and including a first light emitting diode chip, a second light source configured to emit light of a second color different from the first color and including a second light emitting diode chip, the first light emitting diode chip being larger than the second light emitting diode chip, and a single continuous wavelength conversion layer provided in an emitting direction and in front of a light emitting area of the first light source and the second light source, the wavelength conversion layer including a wavelength conversion material configured to wavelength convert light; and a driving control unit configured to drive and control the first light source and the second light source;
 providing a housing having a base and a reflector, the first light source and the second light source being disposed in the reflector, and the wavelength conversion layer being located within the reflector, and over the first light source and the second light source;
 driving and controlling the first light source and the second light source via the driving control unit to adjust a ratio of light amounts emitted from each of the first light source and the second light source, thereby changing a color tone of light emitted from the lamp and making the lamp emit light of a desired color tone.

24. The method for controlling a color tone of light emitted from a lamp according to claim 23, wherein providing includes providing the first light source with an LED chip configured to emit blue light, wherein the wavelength conversion material is a fluorescent material which is configured to emit yellow light when excited by the blue light, and the driving control unit is configured to control current values for driving the first light source and the second light source to achieve a first state in which only the first light source is driven and a second state in which both the first light source and the second light source are driven.

* * * * *